(12) United States Patent
Wolfe et al.

(10) Patent No.: US 11,739,410 B2
(45) Date of Patent: Aug. 29, 2023

(54) THERMAL BARRIER COATINGS

(71) Applicant: The Penn State Research Foundation, University Park, PA (US)

(72) Inventors: Douglas E. Wolfe, University Park, PA (US); Michael P. Schmitt, University Park, PA (US)

(73) Assignee: THE PENN STATE RESEARCH FOUNDATION, University Park, PA (US)

( * ) Notice: Subject to any disclaimer, the term of this patent is extended or adjusted under 35 U.S.C. 154(b) by 474 days.

(21) Appl. No.: 15/624,396

(22) Filed: Jun. 15, 2017

(65) Prior Publication Data
US 2017/0362692 A1    Dec. 21, 2017

Related U.S. Application Data

(60) Provisional application No. 62/350,395, filed on Jun. 15, 2016.

(51) Int. Cl.
   C23C 28/00    (2006.01)
   C23C 4/11     (2016.01)
   (Continued)

(52) U.S. Cl.
   CPC ............... *C23C 4/11* (2016.01); *C23C 4/134* (2016.01); *C23C 10/28* (2013.01); *C23C 10/52* (2013.01);
   (Continued)

(58) Field of Classification Search
   None
   See application file for complete search history.

(56) References Cited

U.S. PATENT DOCUMENTS

6,620,525 B1   9/2003   Rigney et al.
6,677,064 B1   1/2004   Subramanian
(Continued)

FOREIGN PATENT DOCUMENTS

| EP | 1657536 A1 | 5/2006 | |
| GB | 2439389 A * | 12/2007 | ............ C23C 30/00 |
| WO | 2005019784 A1 | 3/2005 | |

OTHER PUBLICATIONS

Chambers et al., "Terbium as an alternative for luminescence sensing of temperature of thermal barrier coating materials", Surface & Coatings Technology, vol. 202 (2007) pp. 688-692. (Year: 2007).*

(Continued)

*Primary Examiner* — Elizabeth Collister
(74) *Attorney, Agent, or Firm* — DINSMORE & SHOHL LLP

(57) ABSTRACT

High temperature stable thermal barrier coatings useful for substrates that form component parts of engines such as a component from a gas turbine engine exposed to high temperatures are provided. The thermal barrier coatings include a multiphase composite and/or a multilayer coating comprised of two or more phases with at least one phase providing a low thermal conductivity and at least one phase providing mechanical and erosion durability. Such low thermal conductivity phase can include a rare earth zirconate and such mechanical durability phase can include a rare earth a rare earth aluminate. The different phases are thermochemically compatible even at high temperatures above about 1200° C.

20 Claims, 8 Drawing Sheets

(51) Int. Cl.
  C23C 10/60 (2006.01)
  C23C 10/28 (2006.01)
  C23C 10/52 (2006.01)
  C23C 4/134 (2016.01)
  C23C 14/08 (2006.01)
  C23C 14/30 (2006.01)
  F01D 5/28 (2006.01)
  F01D 9/04 (2006.01)
  F02C 7/24 (2006.01)

(52) U.S. Cl.
  CPC .......... *C23C 10/60* (2013.01); *C23C 14/081* (2013.01); *C23C 14/30* (2013.01); *C23C 28/321* (2013.01); *C23C 28/3215* (2013.01); *C23C 28/345* (2013.01); *C23C 28/3455* (2013.01); *F01D 5/288* (2013.01); *F01D 9/04* (2013.01); *F02C 7/24* (2013.01); *F05D 2220/323* (2013.01); *F05D 2230/312* (2013.01); *F05D 2230/313* (2013.01); *F05D 2230/90* (2013.01); *F05D 2300/15* (2013.01); *F05D 2300/2112* (2013.01); *F05D 2300/2118* (2013.01); *F05D 2300/5023* (2013.01); *F05D 2300/5024* (2013.01); *Y02T 50/60* (2013.01)

(56) References Cited

U.S. PATENT DOCUMENTS

| | | | |
|---|---|---|---|
| 8,062,759 B2 | 11/2011 | Fu et al. | |
| 8,449,994 B2* | 5/2013 | Tolpygo | C04B 35/488 428/702 |
| 8,470,460 B2 | 6/2013 | Lee | |
| 9,045,830 B2 | 6/2015 | Feist et al. | |
| 10,472,286 B2* | 11/2019 | Jordan | C04B 35/505 |
| 2003/0059653 A1* | 3/2003 | Yamada | C23C 4/11 427/427 |
| 2004/0175597 A1* | 9/2004 | Litton | C23C 14/08 428/472 |
| 2006/0177665 A1 | 8/2006 | Bast et al. | |
| 2006/0177676 A1 | 8/2006 | Bast et al. | |
| 2009/0169914 A1* | 7/2009 | Fu | C23C 28/321 428/610 |
| 2009/0202864 A1* | 8/2009 | Feist | C23C 28/3455 428/690 |
| 2010/0093516 A1* | 4/2010 | Malow | C23C 30/00 501/104 |
| 2010/0136349 A1* | 6/2010 | Lee | C04B 41/52 428/411.1 |
| 2010/0297409 A1* | 11/2010 | Subramanian | C23C 4/11 501/134 |
| 2011/0236657 A1* | 9/2011 | Feist | C23C 4/11 428/411.1 |
| 2015/0259251 A1* | 9/2015 | Hill | C04B 35/44 252/62 |
| 2016/0257618 A1* | 9/2016 | Jordan | C04B 35/505 |

OTHER PUBLICATIONS

Levi ("Stability issues in thermal barrier coatings"), Summer School on Advanced Thermostructural materials, pp. 1-64, 2006. (Year: 2006).*

Wu, Jie et al.; Low-Thermal-Conductivity Rare-Earth Zirconates for Potential Thermal-Barrier-Coating Applications. Journal of the American Ceramic Society. 85. 3031-3035. (2004) (Year: 2004).*

O. Fabrichnaya, et al., "Phase relations in the $ZrO_2$—$Sm_2O_3$—$Y_2O_3$—$Al_2O_3$ system: experimental investigation and experimental modelling," Int. J. Mater. Res. (formerly Z. Metallkd.) vol. 103, 2012, pp. 1469-1487.

R. VaBen, et al., "Overview on advanced thermal barrier coatings," Surface & Coatings Technology, No. 205, Sep. 22, 2010, pp. 938-942.

G. Moskal, et al., Characteristics of Phenomena in Powders Type $RE_2ZR_2O_7$-$Al_2O_3$ in High Temperature Annealing Conditions, Defects and Diffusion Forum, vols. 312-315, Apr. 20, 2011, pp. 583-588.

M. Schmitt, et al., "Thermal conductivity and erosion durability of composite two-phase air plasma sprayed thermal barrier coatings," Surface & Coatings Technology, vol. 279, May 7, 2015, pp. 44-52.

D. Lozano-Mandujano et al., "Thermal Spray Deposition, Phase Stability and Mechanical Properties of $La_2Zr_2O_7$/$LaAlO_3$ Coatings", Journal of Thermal Spray Technology, vol. 26, Jun. 5, 2017 (Jun. 5, 2017), p. 1198-1206.

X. Xie et al., "Thermal cycling behavior and failure mechanism of $LaTi_2Al_9O_{19}$/YSZ thermal barrier coatings exposed to gas flame", Surface & Coatings Technology, vol. 205, Mar. 23, 2011 (Mar. 23, 2011), p. 4291-4298.

International Search Report issued in corresponding International Application No. PCT/US17/37652, dated Sep. 6, 2017.

Supplementary European Search Report dated Mar. 4, 2020; European Application No. EP17814081.

* cited by examiner

THERMAL BARRIER COATINGS

CROSS-REFERENCE TO RELATED APPLICATION

This application claims the benefit of U.S. Provisional Application No. 62/350,395 filed Jun. 15, 2016 the entire disclosure of which is hereby incorporated by reference herein.

STATEMENT REGARDING FEDERALLY SPONSORED RESEARCH

This invention was made with government support under Grant No. DE-SC0004356, awarded by the Department of Energy. The Government has certain rights in the invention.

TECHNICAL FIELD

The present invention is related to a thermal barrier coating (TBC) system including a multilayer or composite arrangement comprised of a primary phase, constituting a high temperature phase stable (>1200° C.) material and low thermal conductivity material, and a secondary phase or phases, constituting a high temperature stable (>1200° C.), tougher material which is thermodynamically stable in contact with the primary phase and results in increased durability such as thermal cyclic life, erosion, wear, corrosion, and calcium magnesium alumino silicate (CMAS) resistance. The invention also relates to processing to produce such a thermal barrier coating, and/or coating system.

BACKGROUND

One of the major problems facing original equipment manufacturers (OEMs) of gas turbine engines is how to achieve increased turbine inlet temperatures, thereby increasing efficiency with a concomitant reduction in fuel usage, operating cost, and greenhouse gas emissions. In 2014 alone, the United States burned over 10.3 billion gallons of jet fuel, spending over $29.6B and resulting in about 100 million metric tons of $CO_2$ emissions. Part of the solution to reduce fuel usage is to apply thermal barrier coatings (TBCs) on engine components which enable higher engine operating temperatures and thus higher fuel efficiency while insulating the engine components from the increased temperatures.

Gas turbine engines perform more efficiently and produce less harmful emissions when operated at elevated temperatures. A 1% increase in turbine efficiency would lead to savings of approximately $308 million on fuel cost industry-wide in the U.S. alone.

Thermal barrier coatings (TBCs) are used to protect hot section engine components from the combustion environment. TBC systems are composed of a superalloy substrate (the engine component), a metallic bond coat, a thermally grown oxide (TGO) layer which forms on the metallic bond coat, and finally, a thermally insulating ceramic top coat. The overall goal of a TBC system is to thermally insulate the engine component from a harsh combustion environment while promoting oxidation resistance and good adhesion to the engine component. With the advent of ceramic based engine components, TBCs can also be used to insulate such components, which are typically a ceramic matrix composites (CMC) such as SiC/SiC, $Al_2O_3/Al_2O_3$, $Si_3N_4/Si_3N_4$, or other mixed combinations of metal oxides, borides, nitrides, or carbides having a respective bond coating and environmental barrier coating (EBC).

The industry standard TBC top coat composition is a 6-8 wt. % yttria stabilized zirconia (YSZ) or yttria partially stabilized zirconia (YPSZ, YTZP) which is deposited into a metastable tetragonal phase (t') via air plasma spray (APS) or electron beam-physical vapor deposition (EB-PVD). A YSZ top coat possesses a low thermal conductivity, a low degree of sintering, and high toughness under normal engine conditions. This high toughness results in resistance to thermal cyclic fatigue as well as resistance to high velocity particle impacts and progressive coating wear, often referred to as erosion. APS depositions yield a lamellar microstructure which offers a comparatively lower initial thermal conductivity due to horizontally aligned porosity. Additionally, APS typically has lower capital and overhead costs making it the preferred technique for coating large scale industrial components for land based turbines. In comparison, EB-PVD depositions yield a columnar microstructure which has a comparatively higher initial thermal conductivity in the as deposited state compared to APS, but offers improved strain tolerance during thermal cycling as well as higher erosion resistance, and therefore overall a higher durability. This makes the EB-PVD process the preferred process for high performance aircraft and the most demanding engines components such as the rotating blades and vanes, but also for stationary components such as vanes, combustors, and shrouds.

When YSZ TBCs experience temperatures of approximately 1200° C. or greater for extended periods of time, the metastable t' YSZ begins to degrade and transforms into equilibrium cubic and tetragonal phases. The equilibrium tetragonal phase is susceptible to an additional transformation into the monoclinic phase upon cooling which yields a volume expansion of about 5% and results in significant stresses which can cause spallation. Due to this instability, YSZ has effectively reached its thermal ceiling as a TBC top coat and therefore new materials must be developed to enable elevated operating temperatures in gas turbine engines.

One of the primary candidate materials for thermal barrier coatings are the rare earth (RE) zirconate pyrochlores ($RE_2Zr_2O_7$). The most common of which is gadolinium zirconate or GZO as described by Maloney in U.S. Pat. No. 6,117,560 and U.S. Pat. No. 6,177,200. These materials possess operating limits of 1500-2100° C. depending on the rare earth selected and exhibit reduced thermal conductivity and sintering compared to YSZ. These properties are particularly desirable for elevated temperature operation where sintering would be more prominent and where a larger thermal gradient must occur in order to maintain the substrate temperature.

Rare earth pyrochlores are also less susceptible to degradation mechanisms which can occur at elevated temperatures such as infiltration and reaction of molten calcium-magnesium-alumino-silicate (CMAS) glasses or glass ceramics. The constituent oxides are common to regions throughout the world and the material system currently showing the most promise for minimizing CMAS degradation are the rare earth pyrochlores.

The primary drawback of the rare earth pyrochlores is a poor toughness, which manifests itself in poor thermal cyclic life and poor erosion resistance, i.e. poor durability. For reference, the fracture toughness ($K_{1C}$) value of GZO is about 1 MPa√m while YSZ is about 4 MPa√m. The poor erosion response of GZO coatings compared to YSZ (in addition to t' Low-k) coatings deposited via EB-PVD is shown in FIG. 1 where the reduction in fracture toughness results in a nearly order of magnitude increase in the erosion rate and thus poor erosion durability. The various rare earth pyrochlore zirconates share a relatively low fracture toughness, and thus experience poor durability. At this time, there is no single TBC material that exhibits all of the desirable properties for higher temperature applications, e.g. low thermal conductivity, low sintering, high temperature phase stability, CMAS resistance, and high durability. There exists a need for new TBC systems which are capable of elevated temperature operation in which durability and performance is improved.

SUMMARY OF THE DISCLOSURE

Advantages of the present disclosure is high temperature (>1200° C.) stable thermal barrier coatings with high durability (e.g. improved properties related to thermal cyclic life, erosion, corrosion, wear, CMAS, volcanic ash, etc.). Such thermal barrier coatings are advantageous for thermally insulating engine components, e.g., metallic and ceramic based engine components such as components of a gas turbine engine.

These and other advantages are satisfied, at least in part, by a thermal barrier coating comprising a multiphase composite or multilayer coating comprised of two or more phases with at least one phase providing a low thermal conductivity and at least one other phase providing durability. The thermal barrier coating can be on a substrate directly or with other materials between the thermal barrier coating and the substrate such as a bond coating, environmental barrier coating (EBC) and/or one or more ceramic interlayers between the thermal barrier coating and the substrate. Advantageously, the ceramic interlayer in contact with any bond coat is thermodynamically stable in contact with the bond coating. The bond coat can be a thermally grown oxide at the operating temperatures of the substrate.

The low thermal conductivity phase can comprise a rare earth zirconate and the durability phase can be composed of a rare earth aluminate. Such low thermal conductivity phase materials typically have poor durability (e.g. higher erosion rate and lower thermal cyclic life) without a phase providing durability. Advantageously, the aluminate is thermodynamically stable with the low conductivity phase at temperatures of at least 1200° C., e.g., at temperatures of at least 1300° C., 1400° C., 1500° C. and greater.

In certain embodiments, the low thermal conductivity phase can comprise a zirconate having about 5 to about 80 mol % $RE_2O_3$, where RE represents a rare earth element which can be selected from Y, La, Ce, Pr, Nd, Pm, Sm, Eu, Gd, Tb, Dy, Ho, Er, Tm, Yb, Lu, Sc. In other embodiments, the low thermal conductivity phase includes two or more different $RE_2O_3$, which together total about 5 to about 80 mol % of the $RE_2O_3$. In addition, the low thermal conductivity phase can further include titania ($TiO_2$) or hafnia ($HfO_2$) or both such as in an amount from more than 0 mol % and up to 95 mol % relative to the zirconate. Further, the low thermal conductivity phase can be in different structures such as a cubic phase such as fluorite phase or pyrochlore phase ($RE_2Zr_2O_7$) or a delta phase ($RE_4Zr_4O_{12}$).

In certain other embodiments, the rare earth aluminate includes two or more of different $RE_2O_3$, and where the second $RE_2O_3$ accounts for no less than 0.5 mol % of the total $RE_2O_3$ content. The rare earth(s) for the aluminate can be selected from Y, La, Ce, Pr, Nd, Pm, Sm, Eu, Gd, Tb, Dy, Ho, Er, Tm, Yb, Lu, Sc. Further, the rare earth aluminate can be in different structures such as a perovskite phase (e.g. rare earth aluminum perovskite—RAP, YAP, LAP, CAP, PAP, NAP, PmAP, SAP, EAP, GAP, TAP, DAP, HAP, ErAP, TmAP, YbAP, LuAP, and/or ScAP), a garnet phase (e.g. rare earth aluminum garnet—RAG; YAG, LAG, CAG, PAG, NAG, PmAG, SAG, EAG, GAG, TAG, DAG, HAG, ErAG, TmAG, YbAG, LuAG, ScAG), a monoclinic phase (e.g. rare earth aluminum monoclinic—RAM; YAM, LAM, CAM, PAM, NAM, PmAM, SAM, EAM, GAM, TAM, DAM, HAM, ErAM, TmAM, YbAM, LuAM, and/or ScAM), or a magnetoplumbite phase. In still further embodiments, the aluminate can include one or more transition metals in a concentration of up to 10 mol %, such as, but not limited to, up to 10 mol % of Ti, Zr, Hf, Cr, Co, Ni, to modify the mechanical properties, optical properties, and/or thermal properties of the phase for improved performance and durability. In still further embodiments, the weight fraction of the durability phase can be between 0.5 wt. % and 95 wt. %.

The thermal barrier coating of the present disclosure and embodiments thereof and/or ceramic interlayers therebetween can be deposited by thermal spray such as air plasma spray (APS), low pressure plasma spray (LPPS), solution precursor plasma spray (SPPS), suspension plasma spray (SPS), plasma spray physical vapor deposition (PS-PVD), electron beam physical vapor deposition (EB-PVD) and variations, derivatives, and combinations thereof.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent similar elements throughout and wherein:

FIG. 2a shows a schematic of a two-phase composite topcoat structure composed of a low thermal conductivity, high temperature stable primary phase (bright) and high toughness, high temperature stable secondary phase (dark) and FIG. 2b is an SEM micrograph of an exemplary composite topcoat with an interlayer beneath. FIG. 2c shows a schematic of a two-phase multilayer topcoat structure composed of a low thermal conductivity, high temperature stable primary phase (bright) and high toughness, high temperature stable secondary phase (dark) and (d) SEM micrograph of an exemplary composite topcoat with an interlayer beneath.

DETAILED DESCRIPTION OF THE DISCLOSURE

Figure 1:
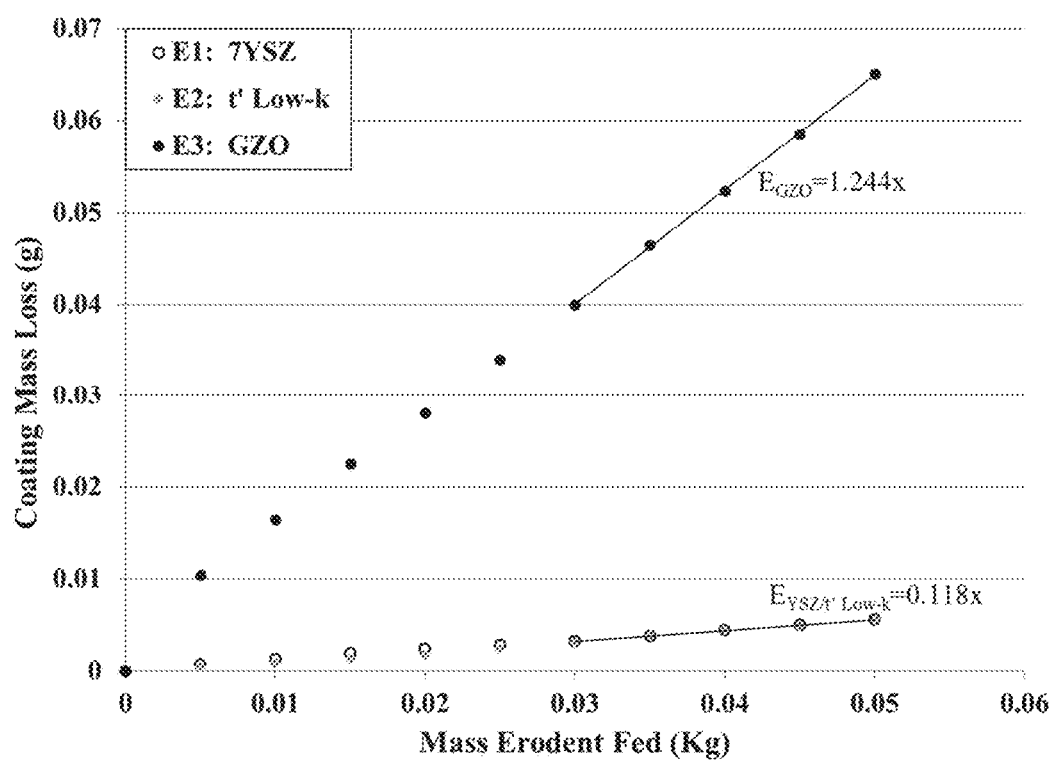
FIG. 1 is a chart showing erosion response of EB-PVD TBCs composed of GZO, YSZ, and t' Low-k showing that in coating form, GZO has an order of magnitude higher erosion rate (slope) compared to YSZ and t' Low-k which were identical.
Figure 2:
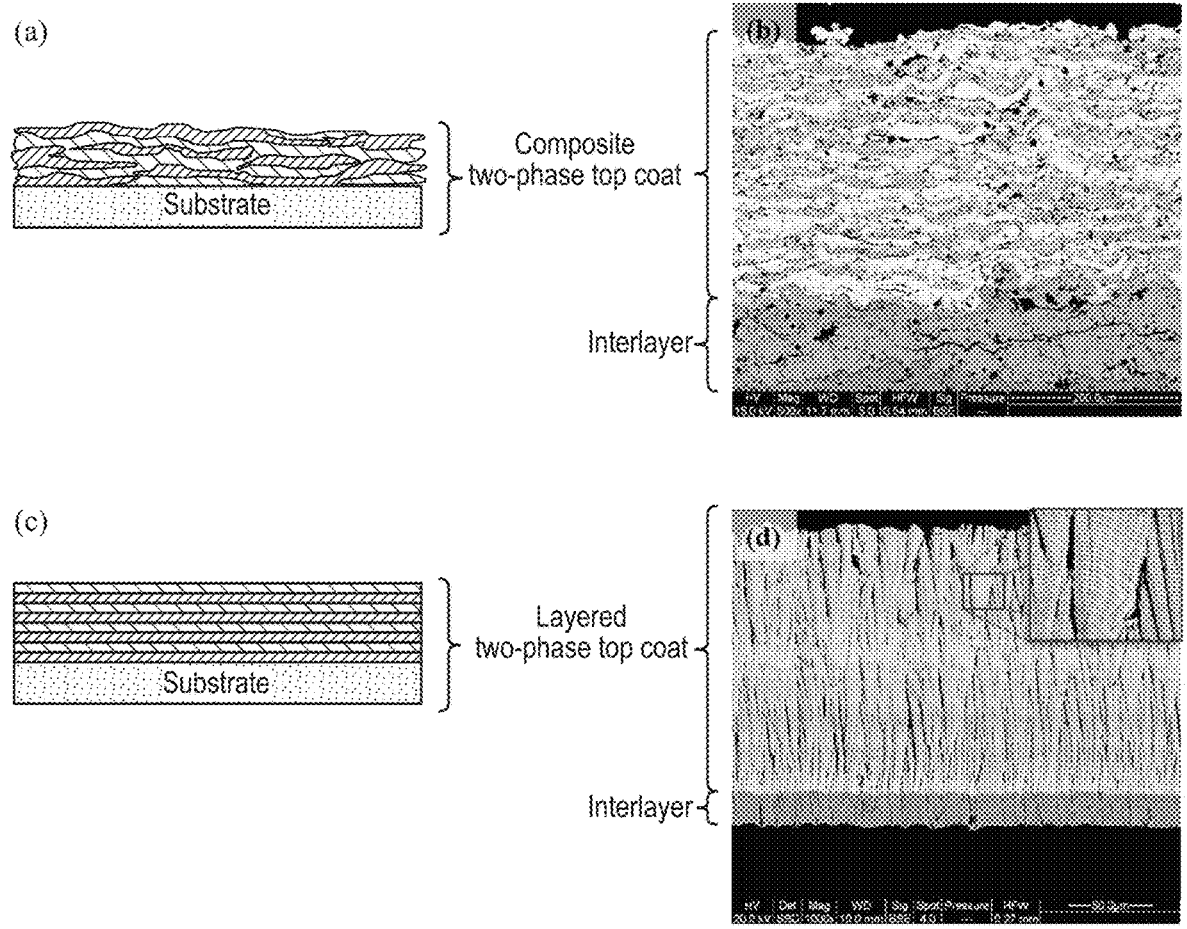
FIGS. 2a-2d illustrate thermal barrier coatings including two phases in accordance with embodiments of the present disclosure.

The present disclosure is directed to thermal barrier coatings that can be applied over substrates such as over engine components. The thermal barrier coatings of the present disclosure can advantageously have one or more of: (i) increased operating temperatures over industry standard YSZ, (ii) lower thermal conductivity than industry standard YSZ, (iii) lower sintering rate than industry standard YSZ; (iv) improved CMAS resistance over industry standard YSZ; (v) improved volcanic ash resistance over industry standard YSZ; (vi) significantly reduced erosion rate over advanced rare earth TBCs such as pyrochlores or high rare earth cubic phase; (vii) increased operating temperatures over previous composite and layered structures due to thermodynamically stable secondary phase; and/or (viii) operating temperatures as high as advanced rare earth pyrochlore TBCs with significantly increased durability and thus reduced long term costs.

The thermal barrier coatings of the present disclosure comprise a multiphase composite and/or a multilayer coating. The multiphase composite and the multilayer coating are comprised of two or more phases with at least one phase providing a low thermal conductivity and at least one other phase providing durability (e.g., improved properties related to erosion, corrosion, wear, thermal cyclic, CMAS or volcanic ash).

Thus, one phase provides low thermal conductivity while exhibiting high temperature (>1200° C.) phase stability. Such phases typically have poor durability (erosion, thermal cyclic, or CMAS). Another phase in the thermal barrier coatings of the present disclosure, however, provides high temperature (>1200° C.) phase stability and high durability (such as high erosion, thermal cyclic, or CMAS). Advantageously, the mechanically durable phase is stable in contact with the low thermal conductivity phase.

In an aspect of the present disclosure, a thermal barrier coating includes a multiphase composite or multilayer coating comprised of two or more phases with at least one phase providing a low thermal conductivity and at least one other phase providing durability. The low thermal conductivity phase can comprise a rare earth zirconate and the durability phase can be composed of a rare earth aluminate.

In certain embodiments, the low thermal conductivity phase can comprise a zirconate having about 5 to about 80 mol % $RE_2O_3$, where RE represents a rare earth element which can be selected from Y, La, Ce, Pr, Nd, Pm, Sm, Eu, Gd, Tb, Dy, Ho, Er, Tm, Yb, Lu, Sc. In other embodiments, the low thermal conductivity phase includes two or more different $RE_2O_3$, which together total about 5 to about 80 mol % of the $RE_2O_3$. In addition, the low thermal conductivity phase can further include titania ($TiO_2$) or hafnia ($HfO_2$) or both such as in an amount from more than 0 mol % and up to 95 mol % relative to the zirconate. Further, the low thermal conductivity phase can be in different structures such as a cubic phase such as fluorite phase or pyrochlore phase ($RE_2Zr_2O_7$) or a delta phase ($RE_4Zr_4O_{12}$).

In certain other embodiments, the rare earth aluminate includes two or more of different $RE_2O_3$, and where the second $RE_2O_3$ accounts for no less than 0.5 mol % of the total $RE_2O_3$ content. The rare earth(s) for the aluminate can be selected from Y, La, Ce, Pr, Nd, Pm, Sm, Eu, Gd, Tb, Dy, Ho, Er, Tm, Yb, Lu, Sc. Further, the rare earth aluminate can be in different structures such as a perovskite phase (e.g. rare earth aluminum perovskite—RAP, YAP, LAP, CAP, PAP, NAP, PmAP, SAP, EAP, GAP, TAP, DAP, HAP, ErAP, TmAP, YbAP, LuAP, and/or ScAP), a garnet phase (e.g. rare earth aluminum garnet—RAG; YAG, LAG, CAG, PAG, NAG, PmAG, SAG, EAG, GAG, TAG, DAG, HAG, ErAG, TmAG, YbAG, LuAG, ScAG), a monoclinic phase (e.g. rare earth aluminum monoclinic—RAM; YAM, LAM, CAM, PAM, NAM, PmAM, SAM, EAM, GAM, TAM, DAM, HAM, ErAM, TmAM, YbAM, LuAM, and/or ScAM), or a magnetoplumbite phase. In still further embodiments, the aluminate can include one or more transition metals in a concentration of up to 10 mol %, such as, but not limited to, up to 10 mol % of Ti, Zr, Hf, Cr, Co, Ni, to modify the mechanical properties, optical properties, and/or thermal properties of the phase for improved performance and durability. In still further embodiments, the weight fraction of the durability phase can be between 0.5 wt. % and 95 wt. %.

The thermal barrier coatings of the present disclosure can be on a substrate directly or with other materials between the thermal barrier coating and the substrate such as a bond coating, environmental barrier coating (EBC) and/or one or more ceramic interlayers between the thermal barrier coating and the substrate. Advantageously, the ceramic interlayer in contact with any bond coat is thermodynamically stable in contact with the bond coating. The bond coat can be a thermally grown oxide at the operating temperatures of the substrate.

The thermal barrier coatings of the present disclosure are useful for substrates that form component parts of engines such as a component from a gas turbine engine exposed to high temperatures. Such substrates can be a metallic, an alloy such as a superalloy, a metal matrix composite (MMC) material, a ceramic, a ceramic matrix composite (CMC) such as SiC/SiC, $Al_2O_3/Al_2O_3$, $Si_3N_4/Si_3N_4$, or other mixed combinations of metal oxides, borides, nitrides, or carbides. Such substrates can have a bond coating and environmental barrier coating (EBC) over the substrate and between the thermal barrier coating of the present disclosure.

The thermal barrier coatings of the present disclosure can be deposited using techniques such as air plasma spray (APS), suspension plasma spray (SPS), solution precursor plasma spray (SPPS), low pressure plasma spray (LPPS), electron beam-physical vapor deposition (EB-PVD), directed vapor deposition (DVD), and/or plasma spray-physical vapor deposition (PS-PVD) composite to design architectures in which the thermal barrier coating topcoat has a minimum of two phases. The two phases can be in a multilayer arrangement or as a composite mixture. In addition, the structure of the thermal barrier coatings can be tailored by known techniques in terms of splat size, splat orientation, aspect ratio, column width, size, density, orientation, growth direction, layer thickness, precipitate size, or morphology such as, but not limited, to 'zig-zag', layering, nanolayering, and variations thereupon.

Example microstructures illustrating embodiments of the present disclosure is shown in FIGS. 2a-2d. The coating shown therein employs a low thermal conductivity/high temperature stable matrix phase with a high temperature stable secondary phase which has a high toughness. The two phases can be in a composite arrangement as shown schematically in FIG. 2a (and shown by the SEM micrographs of FIG. 2b) or as a multilayered arrangement as shown schematically in FIG. 2c (and by the SEM micrograph of FIG. 2d).

The benefits of composite TBCs have been investigated. See, Schmitt, et al., Thermal conductivity and erosion durability of composite two-phase air plasma sprayed thermal barrier coatings, Surf. Coatings Technol. 279 (2015) 44-52. However, a key attribute of the coatings of the present disclosure is that the secondary phase will be of a non-traditional class of TBC materials which exhibit thermochemical compatibility with the primary or 'matrix' phase while still imparting toughness, mechanical and erosion durability.

Figure 3:
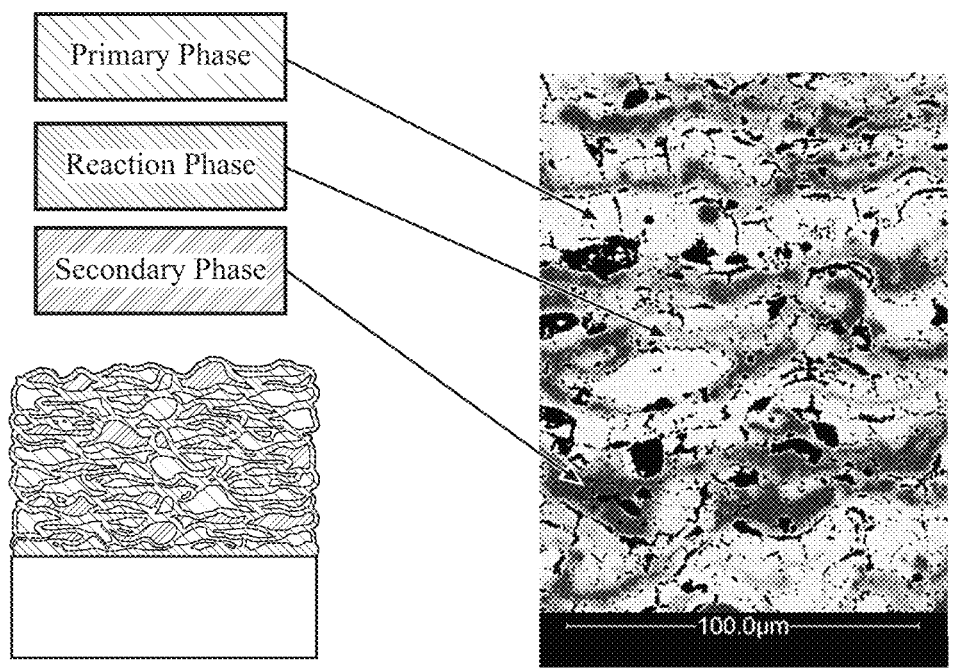
FIG. 3 is a schematic and SEM micrograph of a composite structure prepared by APS which does not incorporate a thermodynamically stable secondary phase and has subsequently severely reacted after being heat treated at 1300° C. for 500 hours.

Other technologies do not consider the thermochemical compatibility and so cannot operate at temperatures of ≥1200° C. for prolonged periods without significant interaction and degradation. This is shown in FIG. 3 where a composite coating composed of an advanced TBC material of $ZrO_2$-25$Nd_2O_3$-5$Y_2O_3$-5$Yb_2O_3$ (NZO; mol %) and a rare earth modified YSZ (t' Low-k) has been heat treated at 1300° C. for 500 hours and has severely reacted resulting in an intermediate phase at the splat boundaries. This reaction consumes the secondary phase and results in a loss of toughness and therefore poor durability. This essentially reduces the viability of other technologies since they cannot fully utilize the thermal stability of the primary high temperature stable phase without severe degradation.

The present disclosure provides particular secondary phase compositions which can impart toughness and/or mechanical/erosion durability while remaining thermochemically and thermodynamically stable at elevated temperatures. This will enable not only the low thermal conductivity of the matrix phases while still maintaining durability, but also take advantage of their high temperature stability, something previous technologies have not been able to achieve. Effectively, the present disclosure enables the first coating system capable of thermodynamically stable operation beyond 1400° C. which improves upon the current state of the art in nearly every manner without a substantial sacrifice in durability. This includes thermal conductivity, thermal cyclic durability, erosion durability, and resistance to CMAS and volcanic ash degradation.

A consideration for the coatings of the present disclosure is selection of a secondary phase which not only has high toughness but also maintains thermodynamic stability at elevated temperatures and when in contact with the primary phase at those elevated temperatures. Previous technologies have been based on utilization of a metastable t' phase zirconia material, doped with one or more rare earth elements, as the toughening secondary phase. Even when doped with various rare earths, the t' phase still destabilizes when experiencing temperatures beyond 1200-1300° C. for extended periods. Additionally, this phase reacts with typical advanced TBC compositions which have high rare earth contents such as GZO or other heavily doped cubic compositions. This disclosure applies a thermodynamics based approach to select appropriate secondary phase compositions which are stable with various high rare earth zirconates.

Figure 4:
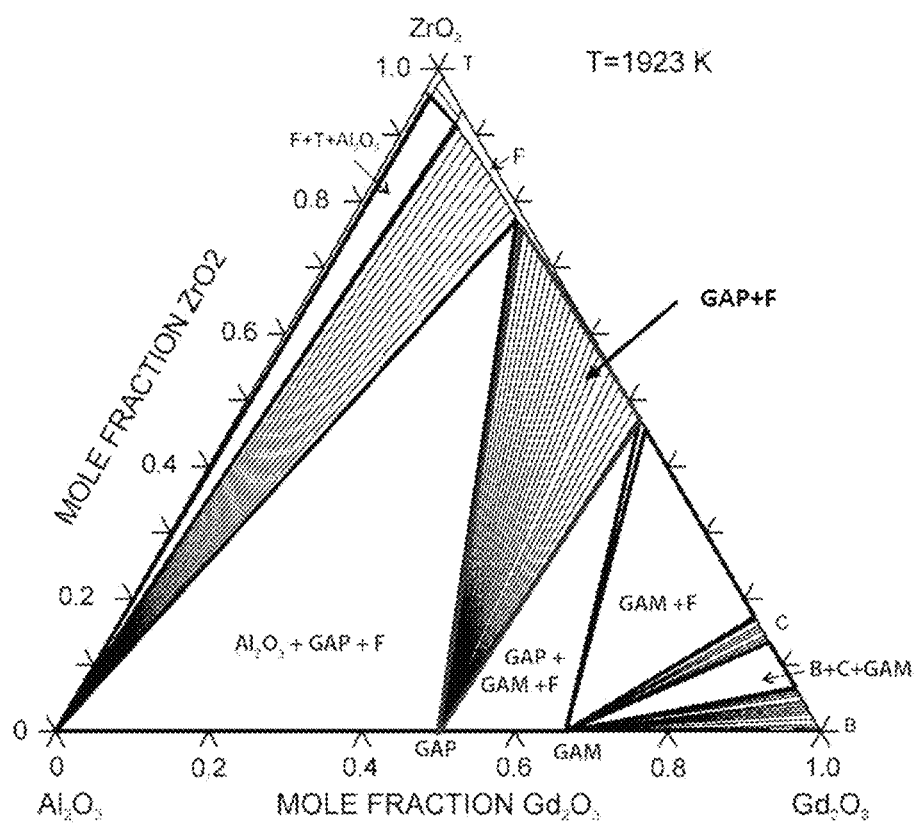
FIG. 4 is a $ZrO_2$—$AlO_{1.5}$—$GdO_{1.5}$ ternary phase diagram isotherm (1650° C.) showing a two phase stability region between the $Gd_2Zr_2O_7$ pyrochlore and $GdAlO_3$ perovskite, suggesting these materials are stable when in contact at elevated temperatures.

For example, FIG. 4 shows the $ZrO_2$—$AlO_{1.5}$—$GdO_{1.5}$ ternary phase diagram isotherm at 1650° C. For the pyrochlore compositions, it is apparent that a two phase stability region exists between GZO and the $GdAlO_3$ gadolinium aluminum perovskite phase—GAP. GAP possesses a phase stability limit of over 1900° C. and a fracture toughness potentially twice that of YSZ according to the literature. Results from XRD data of two-phase GAP-GZO pellets, which were heat treated to 1600° C. for 15 hours and remained the two phases, confirmed that no reaction takes place. The lack of phase change shows the stability of these systems compared to YSZ which begins to experience phase change at 1200° C. Erosion data on dense pellets were collected and showed that GAP has an erosion rate of less than half that of GZO, and that pellets of GAP/GZO have erosion rates nearly as low as that of GAP, indicating effective toughening. Therefore, this system drastically out performs any current composite systems and enables operation near the 1550° C. pyrochlore stability limit of GZO while significantly increasing toughness.

This same analysis can be used to select a variety of rare earth aluminates (with rare earths such as Y, La, Ce, Pr, Nd, Pm, Sm, Eu, Gd, Tb, Dy, Ho, Er, Tm, Yb, Lu, Sc), which have high toughness and thermodynamic stability with high rare earth concentration zirconates (with rare earths such as Y, La, Ce, Pr, Nd, Pm, Sm, Eu, Gd, Tb, Dy, Ho, Er, Tm, Yb, Lu, Sc in pyrochlore, fluorite, and delta phases), thus providing a large swath of materials systems from which to select the phases of the thermal barrier coatings of the present disclosure.

In addition, rare earth hafnates $RE_2Hf_2O_7$ and rare earth titanates $RE_2Ti_2O_7$ could also be utilized in a similar manner where the $HfO_2$ and/or $TiO_2$ to replace the $ZrO_2$ in a range of 0.001-100%. In certain embodiments, the low thermal conductivity phase can further include titania ($TiO_2$) or hafnia ($HfO_2$) or both such as in an amount from more than 0 mol % and up to 95 mol % relative to the zirconate. Additions of transition metals could be used to further tailor the thermal, physical, optical, electrical, or mechanical properties of each phases to create a more robust coating system. These properties include but are not limited to the thermal conductivity, thermal expansion, phase stability limit, emissivity/absorptivity, refractive index, fluorescence, phosphorescence, electrical conductivity, elastic modulus, bulk modulus, shear modulus, hardness, fracture toughness, toughening, wettability, oxygen diffusivity, corrosion resistance, and surface energy.

One concern of the secondary phases is their high thermal conductivity, as the yttrium based aluminates (YAG, YAP, YAM) have thermal conductivities on the order of 3-10 W/m-K at ~1000 C. These concerns have presumably been the reason for the lack of consideration of aluminates as TBC materials as they would not possess the necessary thermal insulation. Fortunately, examination of previous work on composites has shown that a larger thermal conductivity of a secondary phase can have a minor impact on the thermal conductivity of the composite. This is particularly true for low volume percentages of the secondary phases and can be further impacted by the microstructure. Additionally, it appears that the larger rare earth perovskites may have lower thermal conductivities of ~2 W/m-K at 1200° C., a value as low as YSZ. Furthermore, co-doping of multiple rare earths could yield lower thermal conductivities in the aluminate phases due to phonon scattering.

In addition to phase chemistries, the present disclosure provides guidance regarding secondary phase distribution in terms of concentration, size, morphology, distribution, and location. For example, the authors' previous work showed that the erosion response of composite TBCs parallel various mixing laws. See Schmitt et al. Thermal conductivity and erosion durability of composite two-phase air plasma sprayed thermal barrier coatings, Surf. Coatings Technol. 279 (2015) 44-52.

The thermal barrier coatings of the present disclosure can use a prescribed set of deposition parameters and powder morphology characteristics to properly align the microstructure to maximize the toughening of the secondary phase or precipitate out the toughened phase during coating deposition or post heat treatment. These characteristics include, but are not limited to: feedstock particle size distribution (from monomodal to multimodal), combinations of small and large particles sizes between the two phases' powders (from 5 nm minima to 200 μm maxima). In some embodiments the feedstock powder particle size distributions is modified such that one phase is of a size that ranges from 0.000025-40000× that of the other(s). Additional deposition parameters can include sufficient splat sizes to maximize toughening (where splat size is greater >2 nm but less than 25% of the coating thickness), distribution of the two phases (homogenous, heterogeneous, and gradients), aligned lamellae (horizontally or at some angle θ=0°–90° from the horizontal), and splat aspect ratios of up to 1000, and the processing conditions required therein to achieve these parameters. Deposition methods that could be used to achieve these microstructural features include air plasma spray (APS), low pressure plasma spray (LPPS), solution precursor plasma spray (SPPS), suspension plasma spray (SPS), mixed combinations and variations and derivations thereupon. Modifications of these methods to produce microstructures with preferential cracking (e.g. dense vertically cracked) could also be used to further tailor the mechanical response. Other PVD deposition methods include electron beam-physical vapor deposition (EB-PVD), directed vapor deposition (DVD), plasma spray-physical vapor deposition (PS-PVD), and variations thereupon such as co-evaporation, ion assistance, etc. Other techniques such as sputtering, ion plating, HIPIMS, electrophoresis, electroless plating, and dip coating, could also be utilized. The coatings can be deposited such that the microstructure embodies a Zone 1, Zone T or Zone 2 of the structure zone models. Multiple layers could be envisioned such that the interior layers have a particularly property of interest (e.g. lower thermal conductivity via a thermal spray technique) and the outer layers have a separate property of interest (e.g. improved erosion durability via the EB-PVD technique). A PS-PVD system could be utilized such that this microstructure could be deposited in a single system/deposition. Another implementation could be a gradient deposition, where the composite composition gradually changes from one phase to the second, e.g. a higher fracture of the low thermal conductivity phase near the substrate and a higher fraction of the high erosion durability phase nearer to the surface. Yet another implementation could be a gradient microstructural deposition, where the phase fractions remain similar, but the microstructure is changed (e.g. splat-like to columnar, high porosity to low porosity, equiaxed to aligned lamellae) to produce a change in the mechanical and thermal properties through the coating thickness.

The thermal barrier coatings of the present disclosure can be deposited onto a metallic, such as a superalloy substrate, or CMC substrate to protect the substrate from the combustion environment of an engine, such as a gas turbine engine or even used in thermoelectric devices. The superalloys are typically Ni based but can be based on Ni, Fe, Co, or combinations therein, containing Cr, Al, and usually containing additions of Ti, Nb, Zr, Y and refractory metals such as W, Mo, Re, Ta. These alloys have good high temperature mechanical properties and when cast as the preferred single crystal, have very good resistance to creep. To promote oxidation resistance and adhesion of the ceramic coating, a metallic 'bond coat' is often applied between the outer thermal barrier coating layer and the substrate and generally falls into one of two categories, overlay MCrAlY and diffusion aluminide coatings. MCrAlYs (where M is some combination of Co, Ni, or Fe) typically contain relatively large amount of Cr (10-20%) and Al (5-15%) with 1% or less Y and or Hf. Additional reactive alloying elements such as those mentioned for the superalloy can be made to improve mechanical and corrosion properties. These coatings are often deposited via thermal spray methods such as APS, LPPS, HVOF as well as PVD processes such as EB-PVD, DVD, sputtering or cathodic arc-PVD. Diffusion aluminide coatings are formed by diffusing aluminum into the surface of the component. The Al is coated via either a CVD or pack process and subsequently heat treated. Pt is often incorporated into Pt-modified aluminides to impart improved oxidation performance and scale adhesion, where the Pt layer is electroplated prior to the heat treatment diffusion step.

The thermal barrier coatings of the present disclosure can also be deposited onto a ceramic substrate such as a ceramic matrix composite to protect the CMC system from the combustion environment. This system includes the CMC and any coatings such as a bond coating, and environmental barrier coating (EBC). The TBC could be applied directly to any of these layers or used in conjunction with an additional ceramic layer if there are compatibility concerns. Notably, these materials could be processed in bulk form for use as structural ceramics, crucible liners, composites, high temperature insulating components, etc.

EXAMPLES

The following examples are intended to further illustrate certain preferred embodiments of the invention and are not limiting in nature. Those skilled in the art will recognize, or be able to ascertain, using no more than routine experimentation, numerous equivalents to the specific substances and procedures described herein.

For the following experiments, the thermal and mechanical properties of the GZO-GAP composite systems were examined to show their use as a thermal barrier coating according to an embodiment of the present disclosure. In the $Gd_2O_3$—$ZrO_2$—$Al_2O_3$ system, the $Gd_2Zr_2O_7$ pyrochlore (and elevated temperature fluorite) are in thermodynamic equilibrium with the $GdAlO_3$ perovskite, as shown in the ternary phase diagram of alumina, zirconia, and gadolinia of FIG. 4. The highlighted region shown by the arrow in this Figure indicates phase equilibrium between GAP and GZO. Phases: F=Fluorite, GAP=$GdAlO_3$, GAM=$Gd_4Al_2O_9$, B=cubic $Gd_2O_3$, C=$Gd_2O_3$, T=Tetragonal $ZrO_2$.

Composite pellets were fabricated with 10 wt. %, 30 wt. %, and 50 wt. % $GdAlO_3$ (GAP) additions to a $Gd_2Zr_2O_7$ (GZO) matrix, with monolithic GAP and GZO pellets serving as baselines. A minimum of 50 wt. %. GZO was utilized, as the goal was to maintain the beneficial properties of GZO (i.e. high temperature phase stability, low thermal conductivity, and CMAS resistance). Therefore, a minimal addition of the secondary toughening phase was introduced.

Thermal spray powders of GZO (TransTech $Gd_2Zr_2O_7$ powder Lot: A036504 Batch: 3005370) and GAP (TransTech $GdAlO_3$ Lot: A036506 Batch: 3006413) were used as starting powders. In this study a two-step milling approach was used where the first step broke apart the larger agglomerates and particles and the second step finished the powders to the appropriate size for pressing. The first step consisted of ball milling in ethanol using 7 mm cylindrical YSZ media, while the second step utilized 2 mm YSZ spherical media. The two-step approach was necessary to reduce particle size to an average of 0.6 μm. Particle size distribution data was obtained for ball milled powders using a Malvern Mastersizer (Worcestershire, UK). For the composite pellets, prior to pressing the powders were mixed in their respective weight ratios in ethanol with 2 mm YSZ spherical media to promote homogenization and prevent agglomeration. The powders were then uniaxially pressed into 25.4 mm diameter pellets at 19.67 MPa. The pellets were then cold isostatic pressed (CIP) at 200 MPa with no hold. The green bodies were sintered at 1600° C. for 24 hours to obtain dense samples (98+%). The densities of all pellets were measured using Archimedes' method.

Hardness (H) and indentation fracture resistance ($K_{ifr}$) measurements were obtained using a Vickers microhardness indenter (LECO M-400-G1 Hardness Tester, ASTM E384) at 1 kg load. The hardness and indentation fracture resistance were calculated using the equations below.

$$H = \frac{1.854F}{d^2} \quad (1)$$

$$K_{ifr} = \frac{0.018F\sqrt{\frac{E}{H}}}{c^{1.5}} \quad (2)$$

Where F is the applied load in Newtons, d is the diagonal of the indent, and 1.854 is the geometric factor for a square pyramidal indenter tip which was used for the measurements. In Equation 2, E is the elastic modulus in Pascals, H is the hardness in Pascals, c is the average crack length (m), and 0.018 is a constant. In Equation 2, d is the width of the indent and 1.854 is a geometric factor utilized when a square pyramidal indenter tip is used. Twenty indents were made on polished pellets, and crack lengths were excluded if they propagated into an agglomerate or branched, while entire indents were excluded if chipping occurred, as such indents invalidate the measurement technique. The crack length was averaged for each indent and the standard deviation is from a minimum of 7 total indents. The interfacial toughness, (Γ), was also calculated to enable comparison to literature values, where:

$$\Gamma = \frac{K_{ifr}^2}{E} \quad (3)$$

It should be noted that there has been debate regarding the utility of the indentation method for measuring fracture toughness, hence, we here report these values as indentation fracture resistance ($K_{IFR}$). Several authors have discussed a variety of flaws of this technique, with perhaps their most critical observation that a critical crack does not occur and yet the Mode I critical stress intensity factor is calculated. Additionally, it has been pointed out that there are numerous indentation-based equations, all using a 'baseless' scaling factor and none of which work for a variety of ceramics. In contrast, others argue that the indentation technique is useful, provided the guidance from the original description of the technique is followed and understood. In our case, the materials being compared are similar and thus the error of comparing materials from different classes is mitigated. In addition, the similarity of the oxides is expected to produce similar failure, thus further reducing the potential error of the technique. Therefore, even if the magnitude of the resultant fracture resistance may differ from other techniques, the difference between the samples or rankings, is relevant. Furthermore, when investigating samples made of small batch chemistries or small specimens, indentation is often the only realistic methodology.

Shear (G), Elastic (E), and Bulk (K) moduli were obtained by an ultrasonic pulse/echo method. Longitudinal ($L_v$) and shear ($S_v$) velocities through the pellets were measured and Equations 4-8 were used to calculate the elastic properties:

$$G = S_v\rho \quad (4)$$

$$E = \frac{G(3L_c + 2G)}{L_c + G} \quad (5)$$

$$K = \frac{E}{3 - 6\upsilon} \quad (6)$$

$$L_c = L_v^2\rho - 2G \quad (7)$$

$$\upsilon = \frac{1 - 2\frac{S_v^2}{L_v^2}}{2 - 2\frac{S_v^2}{L_v^2}} \quad (8)$$

where ρ is the density, $L_c$ is Lame's constant which is calculated using Equation 6 and υ is Poisson's ratio which is calculated using Equation 8.

Particle erosion testing was performed on the pellets using an in-house erosion rig and 50 μm α-$Al_2O_3$ media (D10=8.20±0.35, D50=35.58±1.21, D90=79.71±3.06). Erosive particle impingement occurred at a 90°, 100 m/sec, and from a distance of nine inches away from the sample surface. The erosive media was fed at a feed rate of 2 g/min in 5 g increments. A total of 50 grams of media was used, resulting in ten mass loss measurements per sample. The process has been described elsewhere in more detail. See Aquaro, et al., Erosion of ductile and brittle materials, Meccanica. 36 (2001) 651-661, also See Borawski et al., Multi-layer coating design architecture for optimum particulate erosion resistance, Wear. 271 (2011) 2782-2792.

High temperature phase stability was determined by long term heat treatments of the pellets at 1400° C. The pellets were evaluated after 20 hour, 100 hour, and 500 hour holds at this temperature.

X-ray diffraction (XRD) was performed using an PANalytical XPert Pro MPD (Westborough, Mass.) while the ICDD Crystallographic Database and Jade 10 software (Livermore, Calif.) were used to identify crystal structure and crystallite size. An FEI Quanta 200 (Hillsboro, Oreg.) Environmental Scanning electron microscopy (ESEM) in combination with Image J analysis software was used to identify and characterize the morphology and grain size and energy dispersive spectroscopy (EDS) was performed using an Oxford Instruments silicon drift (Concord, Mass.) for compositional analysis. Grain size measurements were made using a combination of the intercept method (ASTM E112-13) as well as image analysis of high resolution backscatter SEM images.

Characterization

Figure 6:
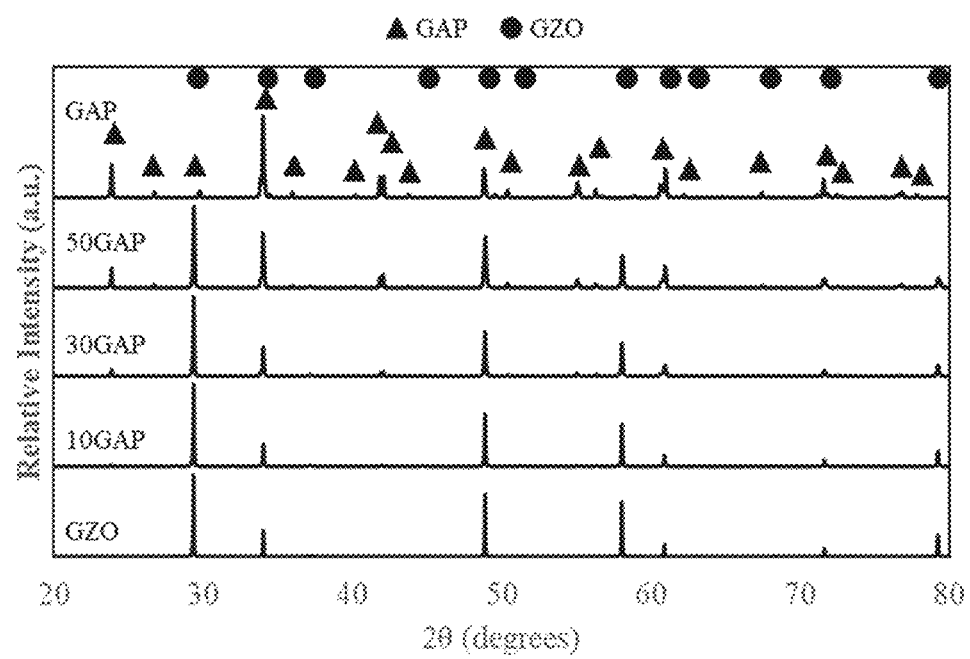
FIG. 6 is an X-ray diffraction pattern of the GAP, GZO, and GAP-GZO pellets after sintering.
Figures 7A, 7B, 7C, 7D, 7E:
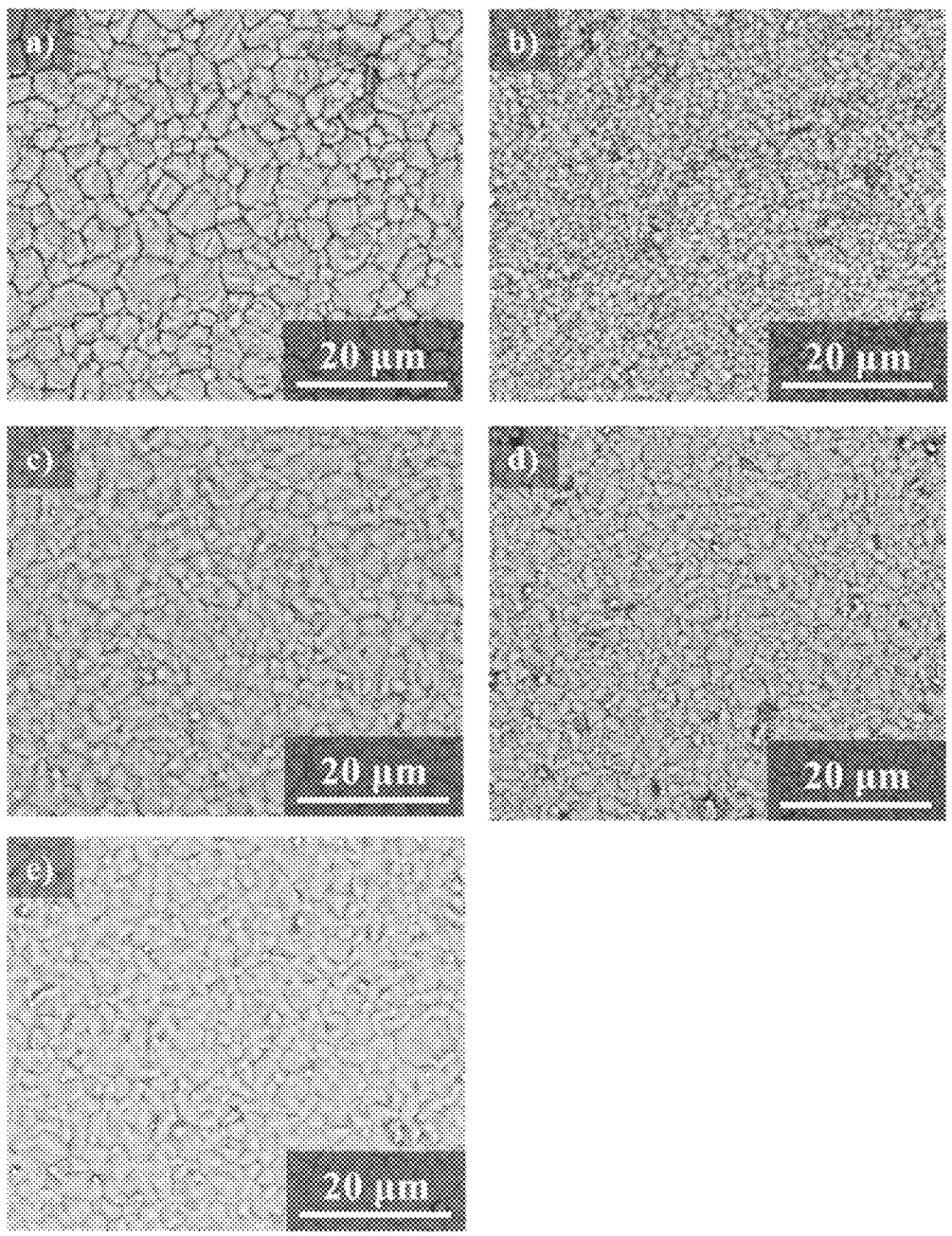
FIGS. 7a-7e are SEM surface micrographs of a) GAP, b) 50 wt % GAP, c) 30 wt % GAP, d) 10 wt % GAP, and e) GZO after sintering at 1600° C. for 24 hours

X-ray diffraction patterns of the sintered pellets are provided in FIG. 6. The pure GAP pellet exhibits an orthorhombic perovskite structure, while the pure GZO pellets exhibit the cubic fluorite structure with very weak pyrochlore ordering. The weak pyrochlore ordering in the as-sintered state is a result of the 1600° C. sintering temperature being above the ~1550° C. pyrochlore stability limit. Therefore, ordering occurs primarily during cooling in the temperature window of ~1550° C. to 1200° (i.e. until the temperature is too low for ordering to occur during the this timeframe). The composite pellets show a mixture of the perovskite and fluorite/pyrochlore phases, with weight fractions calculated from whole pattern refinement agreeing well with the expected weight ratios in Table 1.

TABLE 1

Select composite compositions, powder fractions, ethanol, and media mass/volume used for ball milling of GZO and GAP powders for homogeneous composite pellet processing

| Composition | GZO (g) | GAP (g) | Ethanol (mL) | Media (g) | GAP wt % (post sinter WPF) |
|---|---|---|---|---|---|
| GZO | 100 | 0 | 200 | 900 | 0 |
| 10 wt % GAP | 90 | 10 | 200 | 900 | 8 |
| 30 wt % GAP | 70 | 30 | 200 | 900 | 29 |
| 50 wt % GAP | 50 | 50 | 200 | 900 | 50 |
| GAP | 0 | 100 | 200 | 900 | 100 |

Additionally, the appearance of distinct GAP and GZO phases with no tertiary GZO-GAP reaction phase in all the sintered composite pellets indicate high temperature phase stability at 1600° C. Polished cross sectional SEM images of the pellets used for mechanical property testing are provided in FIGS. 7a-7e, showing the grain sizes and morphology of the pellets. The pure GAP and GZO pellets in FIGS. 7a and 7e, respectively, exhibit grain sizes on the order of ~2 μm. Conversely, the composite pellets in FIG. 7b-d exhibit a finer scale microstructure, with grain sizes on the order of ~1 μm. The larger grains of the single phase pellets are due to grain growth during sintering, while the composites maintain grains which are only slightly larger than the initial starting powder. The microstructural stability of the composites is a further illustration of the thermochemical stability between the two phases while sintering; their low reactivity reduces diffusion and therefore grain growth. This behavior bodes well for potential TBC applications, as sintering and grain growth are some of the contributors to failure due to the resultant increases in the coating elastic modulus, which increases the stresses during thermal cycling.

Mechanical Properties

Figure 8:
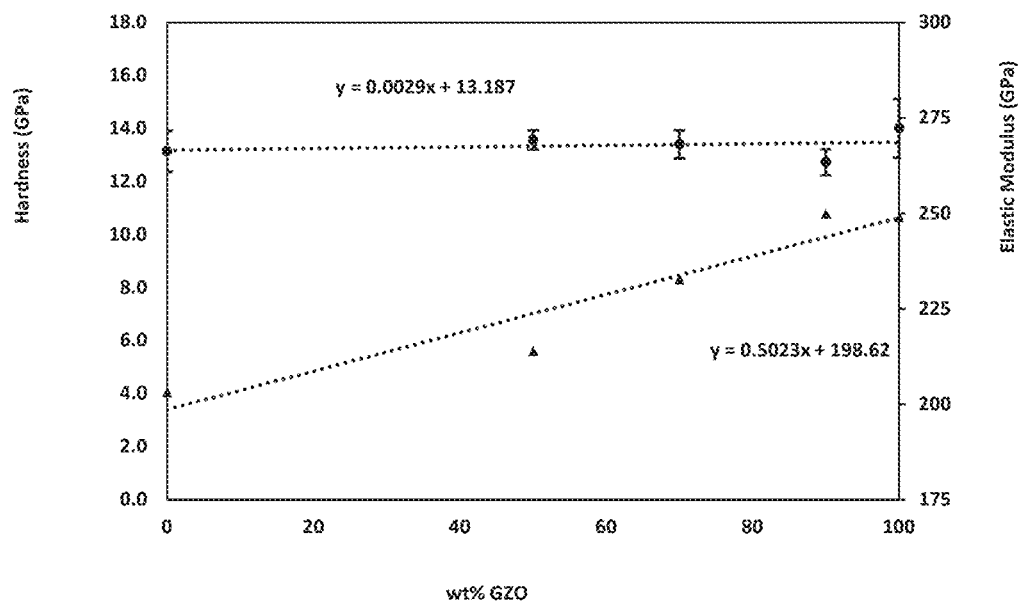
FIG. 8 is a plot of elastic modulus and hardness values for certain thermal barrier materials.

The elastic modulus and hardness values of the pellets are provided in FIG. 8 as a function of wt % GZO with pure GAP on the left. The elastic modulus of the GAP and GZO pellets were measured to be 203 GPa and 244 GPa, respectively, with both values being very similar to those found in literature. The composite pellets exhibit values between those of the parent phases and follow a roughly linear trend correlating to the composition/weight fraction. Therefore, additions of GAP will tend to reduce the elastic modulus of the composites. One of the major performance metrics influenced by elastic modulus is thermal cycling, where thermal expansion mismatch stresses are dependent upon the moduli. Low moduli will tend to lower these stresses, and therefore the lower modulus of GAP could prove beneficial. The hardness of each pellet is also provided in FIG. 8 and exhibits minimal change when transition from pure GAP (13.1±0.8) to pure GZO (14.0±1.1). A high hardness is generally desirable, as this results in improved wear and erosion behavior due to a reduction in the plastic zone. Interestingly, the hardness does not follow the same trend as the elastic modulus. Though hardness and modulus do not always trend together (a good example being a Jominy end quench), they often do in brittle materials. Comparing the observed hardness of 13.1 GPa to literature values for GAP (13.4 GPa and 11.8 GPa (001) to 13.6 GPa (110) GPA) indicates the results are realistic. Therefore, the introduction of GAP to a GZO matrix does not reduce the composite hardness value and therefore does not inhibit wear resistance, but does slightly reduce the modulus which could be beneficial.

Figure 9:
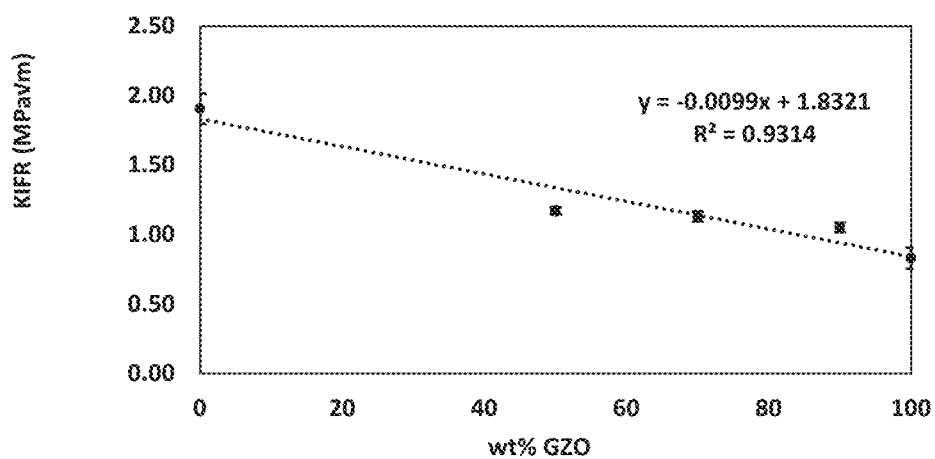
FIG. 9 is a plot of indentation fracture resistance (IFR) values for thermal barrier materials.

According to some authors, outside of the particle parameters (size, density, morphology, velocity) the primary factors in erosion or brittle materials are the hardness and fracture toughness of the coupon. This explains why the low fracture toughness of GZO and the pyrochlore zirconate phases are limiting factors in their durability. The indentation fracture resistance ($K_{IFR}$) values for the composites are provided in FIG. 9 as a function of wt. % GZO with pure GAP on the left. The GZO pellet yields a low IFR value of 0.83 MPa√m, which correlates well with literature. In comparison, the $K_{IFR}$ of GAP is more than twice that of GZO at 1.91 MPa√m in the as sintered conditions. Later experiments have shown that the $K_{IFR}$ for GAP is 4 MPa√m and others report as high as 10 MPa√m. The 50 wt %, 30 wt %, and 10 wt % GAP pellets have $K_{IFR}$ values of 1.17, 1.13, and 1.05 MPa√m. Taking the maximum increase to be Δ1.08 MPa√m (1.9-0.83), the composite values represent increases of 31%, 28%, and 20% of the max, respectively. Therefore, there appears to be a non-volumetric relationship, where the introduction of small amounts of GAP produces an initial increase in the $K_{IFR}$ relative to pure GZO, but this effect saturates after ~10 wt % GAP is added. Density is similar for all samples, and though grain size decreases for the composites, the grain sizes are still << than the crack length size and therefore should not significantly alter the crack behavior and $K_{IFR}$ values. Overall, these results show that mixtures of GAP and GZO can provide improved toughening behavior with respect to pure GZO.

Figure 5:
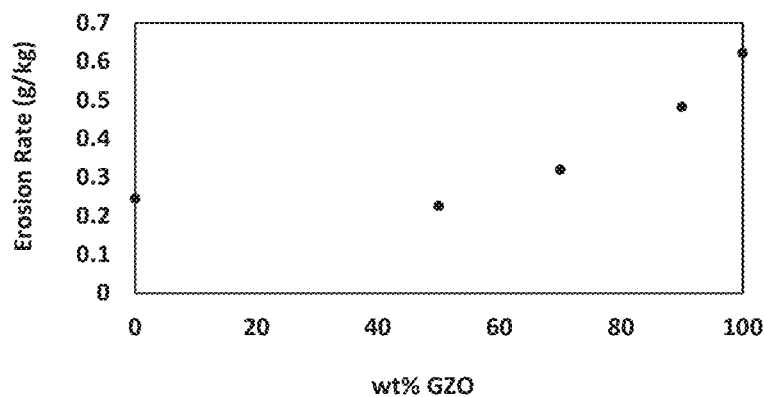
FIG. 5 is a chart showing erosion response of GZO.

The erosion behavior of the pellets is shown in FIG. 5, with mass loss plotted as a function of mass erodent exposure. As expected based on the fracture toughness values, GZO exhibits the highest erosion rate of 0.622 g/kg while GAP yields a substantial improvement in the erosion durability at 0.245 g/kg. This represents a 61% reduction in the overall erosion rate and confirms that the higher toughness of GAP can substantially improve upon the erosion response of GZO-based composites. The composites exhibit an expected trend of decreasing erosion rate with increasing GAP content. Interestingly, the erosion behavior does not appear to follow a linear trend and the erosion rate of the 50 wt % GZO-GAP pellet (0.226 g/kg) is slightly lower than that of the pure GAP pellet which suggests some contribution from the microstructure. As previously mentioned, the erosion behavior is strongly linked to the fracture toughness and hardness. Since the hardness was relatively constant across these samples, the erosion response should therefore largely be dictated by the fracture toughness, and the indentation fracture resistance also exhibited a non-linear relationship with GAP content. The $K_{IFR}$ trend showed a higher than expected effectiveness at low GAP concentrations and lower than expected effectiveness at higher GAP concentrations, e.g. as more GAP is added, the response weakens. If we ignore the pure GAP erosion rate, it does appear that the effectiveness of the GAP additions weakens as we increase GAP concentration (i.e. the erosion rate decreases, but at a decreasing rate). Therefore, the outlier of the data is the pure GAP erosion rate, which would be expected to be lower. A microstructural feature which could explain this anomalous behavior is the slight increase in grain size from the composite pellets to the pure GAP pellet.

Figure 10:
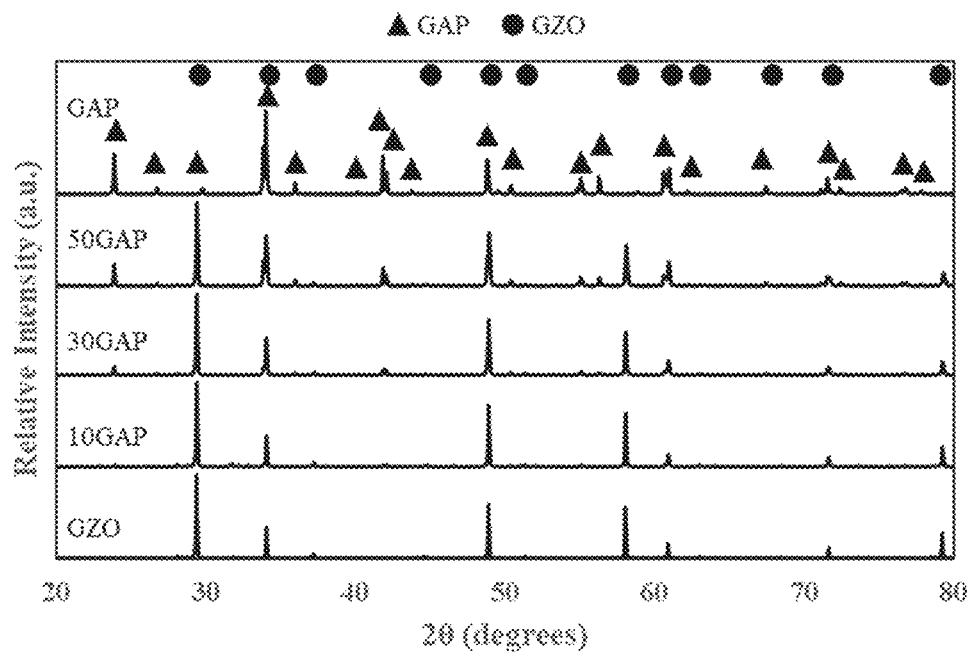
FIG. 10 illustrates XRD patterns for thermal barrier materials heat treated at 1400° C. over time.

A non-linear relationship is in fact ideal, as this would require less GAP for a given reduction in the erosion rate with respect to GZO. Non-linear behavior has been previously observed in the erosion of air plasma spray (APS) composite coatings containing a weak cubic matrix phase and a toughening secondary phase. It is envisioned that combining this effect with the GAP-GZO composites can yield a substantial reduction in the erosion rate of GZO-based coatings High Temperature Phase Stability The initial results from sintering for 24 hours at 1600 C indicated compatibility between the GAP and GZO phases. To further solidify this observation, longer term heat treatments up to 500 hours were conducted on 50 wt % GZO-GAP pellets to study the high temperature phase stability of the GZO-GAP system. FIG. 10 provides the XRD patterns of 50 wt % GZO-GAP pellets, which were heat treated at 1400° C. for 0 (baseline), 20, 100, and 500 hours. The 50/50 composite would have the highest interfactial volume and thus if a reaction were to occur, we would expect to observe it with this composition. The GAP and GZO phases remained unchanged throughout the heat treatment, with GAP exhibiting the orthorhombic perovskite and GZO exhibit fluorite/weak pyrochlore. Most importantly, no new phases formed in this time. This data shows thermodynamic compatibility of these two materials at 1400° C., confirming that GZO-GAP composites are phase stable under these high temperature testing conditions. Therefore, combined with the erosion results, this represents a system that is capable of operation at high temperature, with low thermal conductivity, and improved erosion behavior over that of YSZ and GZO for high temperature applications.

Figure 11:
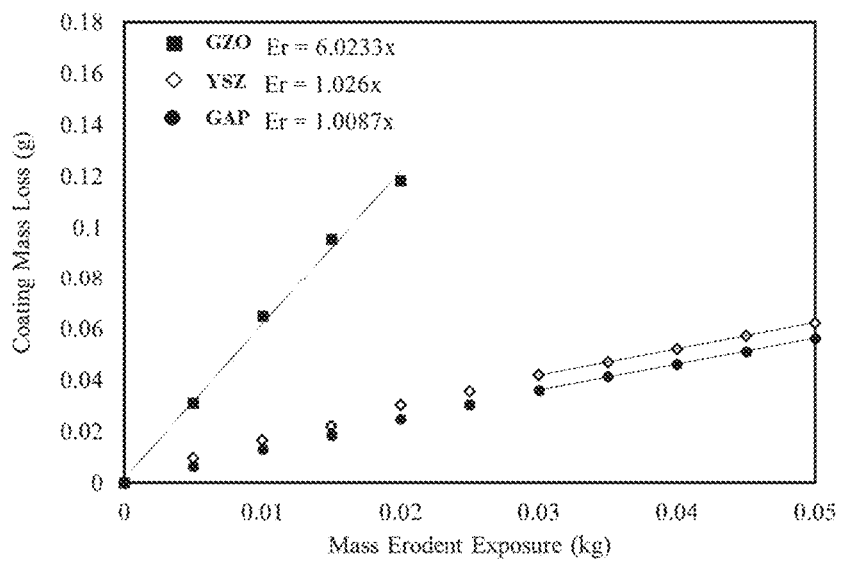
FIG. 11 is a chart showing erosion response of coatings composed of GZO, GAP-GZO composite (50 wt % GAP), and YSZ, indicating the composites provide a 6× improvement in erosion life over GZO and comparable to that of YSZ.

Table 2 provides the porosity and grain size information for the pellets before and after the 1400° C. heat treatment. The grain size of the GZO pellet increased by 22% to 2.09 µm over the duration of the heat treatment. The grain size of the GAP pellet showed only negligible increase in the grain size with a final value at 2.75 µm. Overall, this level of grain growth is expected at these times and temperatures for these materials. In the composite pellets, the initial grain sizes were all smaller than the pure phase pellets and experienced small increased over time. The post heat treat grain size trended as decreasing grain size with increasing GAP content. This is attributed to the increase in contact area/interfacial volume between the two phases, which reaches as maximum at ~50% mixing and therefore a very small grain size of 0.94 µm for the 50 wt % GAP sample after 500 hours. This demonstrates that the thermochemical compatibility of these phases provides microstructural stability over time at temperature. Behavior such as this can yield potential benefits in terms of thermal cycling, where densification caused by sintering results in larger moduli values, which produces larger stresses and ultimately contribute to coating failure. The thermal cycling behavior will be the focus of future studies on coatings of these compositions. Furthermore, APS coatings have been applied and have shown upwards of 6× improvement in the erosion performance compared to GZO and in some cases, parallels that of YSZ, as shown in FIG. 11.

TABLE 2

Density and grain size of the pellets before and after heat treatment at 1400° C. for 500 hours.

| Composition | Density (As-sintered; %) | Density (Post HT; %) | Gram Size (As-sintered; µm) | Grain Size (Post-HT; µm) |
| --- | --- | --- | --- | --- |
| GZO | 99.5 | 100 | 1.63 ± 0.30 | 2.09 ± 0.18 |
| 90-10 wt % GZO-GAP | 99.5 | 99.1 | 1.23 ± 0.08 | 1.82 ± 0.14 |
| 70-30 wt % GZO-GAP | 99.0 | 100 | 1.41 ± 0.16 | 1.47 ± 0.12 |
| 50-50 wt % GZO-GAP | 99.3 | 99.4 | 0.74 ± 0.18 | 0.94 ± 0.06 |
| GAP | 98.7 | 100 | 2.68 ± 0.47 | 2.75 ± 0.07 |

Figure 12:
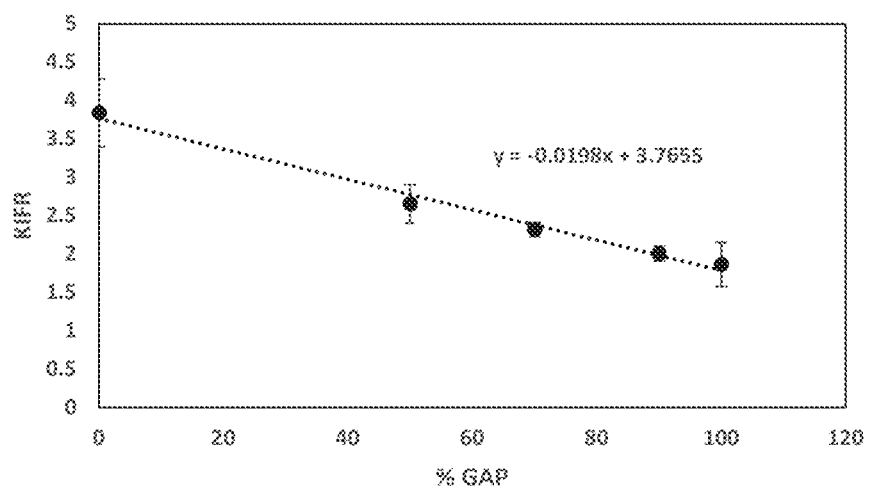
FIG. 12 is a plot of fracture resistance for thermal barrier materials after heat treatment.

The fracture resistance after heat treatment is provided in FIG. 12. The $K_{IFR}$ values tend to uniformly increase for all of the samples due to increases in pellet density. The GAP phase again exhibits a significantly larger fracture resistance than GZO. The fracture resistance of the heat treated pellets show a much more linear trend than the as-sintered pellets.

The data and experiments provided herein show that thermal barrier coatings comprising two or more phases with at least one phase providing a low thermal conductivity and at least one phase providing mechanical durability can have improved properties over conventional YSZ based coatings. The data and experiments herein provide TBC materials system, such as GZO-GAP coating based systems, which can enable utilization of the beneficial properties of a low thermal conductivity phase (e.g., GZO), while ameliorating its mechanical and erosion durability issues through incorporation of a phase stable, chemically compatible secondary mechanical durability phase (e.g., GAP). It was shown that the composite of GAP-GZO can be fabricated which are phase stable, thermochemically compatible, and microstructurally stable during sintering at 1600° C. as well as for over 500 hours at 1400° C. Furthermore, the incorporation of 10 wt % GAP resulted in a 27% increase in fracture toughness while decreasing the erosion rate by over 22%. This represents a significant improvement in the durability with respect to GZO TBCs, while maintaining the beneficial high temperature phase stability of the GZO system. Moreover, the grain size of these composites was maintained over time, yielding a more microstructurally stable compound than pure-phase coatings.

Only the preferred embodiment of the present invention and examples of its versatility are shown and described in the present disclosure. It is to be understood that the present invention is capable of use in various other combinations and environments and is capable of changes or modifications within the scope of the inventive concept as expressed herein. Thus, for example, those skilled in the art will recognize, or be able to ascertain, using no more than routine experimentation, numerous equivalents to the specific substances, procedures and arrangements described herein.

Such equivalents are considered to be within the scope of this invention, and are covered by the following claims.

What is claimed is:

1. A thermal barrier coating over a substrate, the thermal barrier coating comprising a multiphase composite layer comprised of two or more phases with at least one phase providing a low thermal conductivity and at least one phase providing durability,
    wherein the low thermal conductivity phase comprises a rare earth zirconate having about 5 to about 80 mol % $RE_2O_3$, where RE is selected from Y, La, Ce, Pr, Nd, Pm, Sm, Eu, Gd, Tb, Dy, Ho, Er, Tm, Yb, Lu, and Sc,
    wherein in the multiphase composite layer the low thermal conductivity phase includes a pyrochlore phase ($RE_2Zr_2O_7$), and/or a delta phase ($RE_4Zr_4O_{12}$),
    the durability phase in the multiphase composite layer comprises a rare earth aluminate and has a weight fraction greater than 51 wt. % and not exceeding 95 wt. %,
    the aluminate consists of a perovskite phase including YAP, LAP, CAP, PAP, PmAP, SAP, EAP, GAP, TAP, DAP, HAP, ErAP, TmAP, YbAP, LuAP, ScAP, and
    the rare earth aluminate is thermodynamically stable in contact with the low thermal conductivity phase at temperatures of at least 1200° C.

2. The thermal barrier coating of claim 1, which includes a bond coating on the substrate and/or one or more ceramic interlayers between the multiphase composite layer and the substrate.

3. The thermal barrier coating of claim 2, wherein the thermal barrier coating and/or ceramic interlayer is deposited by thermal spray such as air plasma spray (APS), low pressure plasma spray (LPPS), solution precursor plasma spray (SPPS), suspension plasma spray (SPS), plasma spray physical vapor deposition (PS-PVD), electron beam physical vapor deposition (EB-PVD), and variations, derivatives, and combinations thereof.

4. The thermal barrier coating of claim 1, wherein the low thermal conductivity phase includes two or more different $RE_2O_3$.

5. The thermal barrier coating of claim 1, wherein the low thermal conductivity phase further includes titania ($TiO_2$) or hafnia ($HfO_2$).

6. The thermal barrier coating of claim 1, wherein the rare earth aluminate includes two or more of different $RE_2O_3$, and where the second $RE_2O_3$ accounts for no less than 0.5 mol % of the total $RE_2O_3$ content.

7. The thermal barrier coating of claim 6, wherein the aluminate includes one or more transition metals of Ti, Zr, Hf, Cr, Co, Ni, in a concentration of up to 10 mol %.

8. The thermal barrier coating of claim 1, wherein the substrate is a metallic component of a gas turbine engine.

9. The thermal barrier coating of claim 1, wherein the substrate is a ceramic component of a gas turbine engine.

10. The thermal barrier coating of claim 1, wherein the zirconate comprises $Gd_2Zr_2O_7$ and the rare earth aluminate comprises $GdAlO_3$.

11. A thermal barrier coating over a substrate, the thermal barrier coating comprising a multiphase composite and/or a multilayer coating consisting of two phases with one phase providing a low thermal conductivity and the other phase providing durability,
    wherein the low thermal conductivity phase consists of a rare earth zirconate having about 5 to about 80 mol % $RE_2O_3$, where RE is selected from Y, La, Ce, Pr, Nd, Pm, Sm, Eu, Gd, Tb, Dy, Ho, Er, Tm, Yb, Lu, and Sc,
    the durability phase consists of a rare earth aluminate and has a weight fraction between 0.5 wt. % and 95 wt. %,
    the aluminate consists of a perovskite phase ($RE_2O_3$), where the rare earth is selected from Y, La, Ce, Pr, Nd, Pm, Sm, Eu, Gd, Tb, Dy, Ho, Er, Tm, Yb, Lu, Sc, and
    the rare earth aluminate is thermodynamically stable in contact with the low thermal conductivity phase at temperatures of at least 1200° C.,
    wherein the thermal barrier coating comprises a plurality of alternating layers of the low thermal conductivity phase and the durability phase.

12. The thermal barrier coating of claim 11, wherein the low thermal conductivity phase includes a fluorite phase, a pyrochlore phase ($RE_2Zr_2O_7$), or a delta phase ($RE_4Zr_4O_{12}$).

13. The thermal barrier coating of claim 11, wherein the thermal barrier coating and/or ceramic interlayer is deposited by thermal spray such as air plasma spray (APS), low pressure plasma spray (LPPS), solution precursor plasma spray (SPPS), suspension plasma spray (SPS), plasma spray physical vapor deposition (PS-PVD), electron beam physical vapor deposition (EB-PVD), and variations, derivatives, and combinations thereof.

14. The thermal barrier coating of claim 11, wherein the zirconate comprises $Gd_2Zr_2O_7$ and the rare earth aluminate comprises $GdAlO_3$.

15. The thermal barrier coating of claim 11, wherein the durability phase has a weight fraction greater than 51 wt. % and not exceeding 95 wt. %.

16. A thermal barrier coating over a substrate, the thermal barrier coating comprising a multilayer coating comprised of two or more phases with at least one phase providing a low thermal conductivity and at least one phase providing durability,
    wherein the low thermal conductivity phase comprises a rare earth zirconate having about 5 to about 80 mol % $RE_2O_3$, where RE is selected from Y, La, Ce, Pr, Nd, Pm, Sm, Eu, Gd, Tb, Dy, Ho, Er, Tm, Yb, Lu, and Sc,
    the durability phase comprises a rare earth aluminate and has a weight fraction between 0.5 wt. % and 95 wt. %,
    the aluminate consists of a perovskite phase, where the rare earth is selected from Y, La, Ce, Pr, Nd, Pm, Sm, Eu, Gd, Tb, Dy, Ho, Er, Tm, Yb, Lu, Sc, and
    the rare earth aluminate is thermodynamically stable in contact with the low thermal conductivity phase at temperatures of at least 1200° C.,
    the thermal barrier coating comprising a plurality of alternating layers of the low thermal conductivity phase and the durability phase.

17. The thermal barrier coating of claim 16, wherein the low thermal conductivity phase includes a fluorite phase, a pyrochlore phase ($RE_2Zr_2O_7$), or a delta phase ($RE_4Zr_4O_{12}$).

18. The thermal barrier coating of claim 16, wherein the thermal barrier coating is deposited by thermal spray such as air plasma spray (APS), low pressure plasma spray (LPPS), solution precursor plasma spray (SPPS), suspension plasma spray (SPS), plasma spray physical vapor deposition (PS-PVD), electron beam physical vapor deposition (EB-PVD), and variations, derivatives, and combinations thereof.

19. The thermal barrier coating of claim 16, wherein the zirconate comprises $Gd_2Zr_2O_7$ and the rare earth aluminate comprises $GdAlO_3$.

20. A thermal barrier coating over a substrate, the thermal barrier coating comprising a multiphase composite layer comprised of two or more phases with at least one phase providing a low thermal conductivity and at least one phase providing durability, wherein the low thermal conductivity phase comprises a rare earth zirconate having about 5 to about 80 mol % $RE_2O_3$, where RE is selected from Y, La, Ce, Pr, Nd, Pm, Sm, Eu, Gd, Tb, Dy, Ho, Er, Tm, Yb, Lu, and Sc, wherein in the multiphase composite layer the low thermal conductivity phase includes a pyrochlore phase ($RE_2Zr_2O_7$), and/or a delta phase ($RE_4Zr_4O_{12}$), the durability phase in the multiphase composite layer comprises a rare earth aluminate and has a weight fraction greater than 51 wt. % and not exceeding 95 wt. %, the aluminate is in the perovskite phase including YAP, LAP, CAP, PAP, PmAP, SAP, EAP, GAP, TAP, DAP, HAP, ErAP, TmAP, YbAP, LuAP, ScAP, or garnet phase, or monoclinic phase, where the rare earth of the garnet phase or monoclinic phase is selected from Y, La, Ce, Pr, Nd, Pm, Sm, Eu, Gd, Tb, Dy, Ho, Er, Tm, Yb, Lu, Sc, and the rare earth aluminate is thermodynamically stable in contact with the low thermal conductivity phase at temperatures of at least 1200° C., wherein the rare earth aluminate and the rare earth zirconate have the same rare earth element.

* * * * *